United States Patent
Saito

(10) Patent No.: US 10,644,059 B2
(45) Date of Patent: May 5, 2020

(54) SOLID-STATE IMAGING DEVICE AND IMAGING APPARATUS

(71) Applicant: OLYMPUS CORPORATION, Hachioji-shi, Tokyo (JP)

(72) Inventor: Haruhisa Saito, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 16/036,347

(22) Filed: Jul. 16, 2018

(65) Prior Publication Data

US 2018/0323231 A1 Nov. 8, 2018

Related U.S. Application Data

(63) Continuation of application No. PCT/JP2016/051393, filed on Jan. 19, 2016.

(51) Int. Cl.
*H01L 27/146* (2006.01)
*H01L 25/065* (2006.01)
(Continued)

(52) U.S. Cl.
CPC ...... *H01L 27/14645* (2013.01); *H01L 23/481* (2013.01); *H01L 23/522* (2013.01); *H01L 25/065* (2013.01); *H01L 25/07* (2013.01); *H01L 25/18* (2013.01); *H01L 27/14* (2013.01); *H01L 27/146* (2013.01); *H01L 27/1469* (2013.01); *H01L 27/14612* (2013.01); *H01L 27/14634* (2013.01); *H01L 27/14636* (2013.01); *H04N 5/378* (2013.01); *H01L 27/1464* (2013.01); *H01L 27/14621* (2013.01); *H01L 27/14627* (2013.01)

(58) Field of Classification Search
CPC ............ H01L 25/0657; H01L 25/0652; H01L 27/14632; H01L 27/14634; H01L 27/14636; H01L 27/14645; H01L 27/14; H01L 27/146; H01L 27/14612; H01L 27/1469
See application file for complete search history.

(56) References Cited

U.S. PATENT DOCUMENTS

2017/0230598 A1* 8/2017 Takayanagi ....... H01L 27/14643

FOREIGN PATENT DOCUMENTS

| JP | 2014-195112 A | 10/2014 |
|----|---------------|---------|
| JP | 2014-216859 A | 11/2014 |

(Continued)

OTHER PUBLICATIONS

International Search Report dated Apr. 5, 2016, issued in counterpart International Application No. PCT/JP2016/051393, w/English translation (2 pages).

*Primary Examiner* — Sue A Purvis
*Assistant Examiner* — Scott Stowe
(74) *Attorney, Agent, or Firm* — Westerman, Hattori, Daniels & Adrian, LLP

(57) ABSTRACT

A solid-state imaging device has a first substrate, a second substrate, and a third substrate. The first substrate has a plurality of first photoelectric conversion elements. The second substrate has a plurality of first through electrodes. The plurality of first photoelectric conversion elements are disposed in a pixel area. The plurality of first through electrodes are disposed only in a second area around a first area corresponding to the pixel area.

6 Claims, 11 Drawing Sheets

(51) Int. Cl.
*H01L 25/18* (2006.01)
*H01L 23/522* (2006.01)
*H01L 25/07* (2006.01)
*H01L 27/14* (2006.01)
*H01L 23/48* (2006.01)
*H04N 5/378* (2011.01)

(56) References Cited

FOREIGN PATENT DOCUMENTS

| | | |
|---|---|---|
| JP | 2015-135938 A | 7/2015 |
| WO | 2015/093017 A1 | 6/2015 |

\* cited by examiner

US 10,644,059 B2

SOLID-STATE IMAGING DEVICE AND IMAGING APPARATUS

This application is a continuation application based on International Patent Application No. PCT/JP2016/051393 filed on Jan. 19, 2016, the content of which is incorporated herein by reference.

BACKGROUND OF THE INVENTION

Field of the Invention

The present invention relates to a solid-state imaging device and an imaging apparatus.

Description of Related Art

A solid-state imaging device having a plurality of substrates has been disclosed. Japanese Unexamined Patent Application, First Publication No. 2014-195112 discloses a solid-state imaging device in which a plurality of substrates are connected to one another by microbumps. FIG. 11 shows a configuration of a solid-state imaging device 1010 employing the technology disclosed in Japanese Unexamined Patent Application, First Publication No. 2014-195112. FIG. 11 shows a section of the solid-state imaging device 1010.

As shown in FIG. 11, the solid-state imaging device 1010 has a first substrate 1100, a second substrate 1200, a third substrate 1300, a connection layer 1400, a plurality of micro lenses ML, and a plurality of color filters CF. FIG. 11 shows reference numerals of one micro lens ML and one color filter CF as representatives.

The first substrate 1100 has a plurality of photoelectric conversion elements 1101. FIG. 11 shows a reference numeral of one photoelectric conversion element 1101 as a representative. The first substrate 1100 has transistors in addition to the plurality of photoelectric conversion elements 1101. The transistors constitute a reading circuit for reading signals from the photoelectric conversion elements 1101. The first substrate 1100 constitutes a back-side-illumination element. The color filters CF are disposed on the surface of the first substrate 1100 and the micro lenses ML are disposed on the color filters CF.

The connection layer 1400 is disposed between the first substrate 1100 and the second substrate 1200. The connection layer 1400 has microbumps 1401, pads 1402, and pads 1403. FIG. 11 shows reference numerals of one microbump 1401, one pad 1402, and one pad 1403 as representatives. The pads 1402 are electrically connected to the first substrate 1100. The pads 1403 are electrically connected to the second substrate 1200. The microbumps 1401 are disposed between the pads 1402 and the pads 1403. The first substrate 1100 and the second substrate 1200 are electrically connected to each other by the microbumps 1401, the pads 1402, and the pads 1403.

The second substrate 1200 has a plurality of through electrodes 1201 (through-silicon vias). FIG. 11 shows a reference numeral of one through electrode 1201 as a representative. The through electrodes 1201 penetrate one or more layers constituting the second substrate 1200. The second substrate 1200 and the third substrate 1300 are electrically connected to each other by the through electrodes 1201. The second substrate 1200 has an AD conversion circuit that performs analog-to-digital conversion on signals read from the plurality of photoelectric conversion elements 1101. The third substrate 1300 has a memory circuit that stores the signals processed by the AD conversion circuit.

The signals generated by the plurality of photoelectric conversion elements 1101 are simultaneously read from the plurality of photoelectric conversion elements 1101 by the transistors. The signals read from the plurality of photoelectric conversion elements 1101 are processed by the AD conversion circuit. The signals processed by the AD conversion circuit are stored in the memory circuit. By so doing, a simultaneous shutter is achieved.

SUMMARY OF THE INVENTION

According to a first aspect of the present invention, the solid-state imaging device has a first substrate, a second substrate, and a third substrate. The first substrate has a first principal surface, a second principal surface, and a plurality of first photoelectric conversion elements. The first principal surface and the second principal surface face in opposite directions. The plurality of first photoelectric conversion elements are disposed in a matrix form. The second substrate has a third principal surface, a fourth principal surface, one or more first layers, and a plurality of first through electrodes. The third principal surface and the fourth principal surface face in opposite directions. The third principal surface faces the second principal surface. The plurality of first through electrodes penetrate at least one of the first layers. The third substrate has a fifth principal surface and a sixth principal surface. The fifth principal surface and the sixth principal surface face in opposite directions. The fifth principal surface face the fourth principal surface. The plurality of first photoelectric conversion elements are disposed in a pixel area. The plurality of first through electrodes are disposed only in a second area around a first area corresponding to the pixel area. The first substrate and the second substrate are electrically connected to each other and the second substrate has a first memory circuit, a processing circuit, and a scanning circuit. The first memory circuit is disposed in the first area and temporarily stores signals output from the plurality of first photoelectric conversion elements. The processing circuit is disposed in the first area and processes the signals stored in the first memory circuit. The scanning circuit is disposed in the second area and controls the plurality of first photoelectric conversion elements, the first memory circuit, and the processing circuit. The third substrate has a second memory circuit connected to the scanning circuit by the plurality of first through electrodes and storing the signals processed by the processing circuit.

According to a second aspect of the present invention, in the first aspect, the solid-state imaging device may further have a plurality of microbumps disposed between the second principal surface and the third principal surface. Each microbump included in the plurality of microbumps may be disposed for each first photoelectric conversion element included in the plurality of first photoelectric conversion elements and may electrically connect the first photoelectric conversion element and the first memory circuit to each other.

According to a third aspect of the present invention, in the first aspect, the second substrate may have a plurality of processing circuits including the processing circuit. Each processing circuit included in the plurality of processing circuits may be disposed for each column in an arrangement of the plurality of first photoelectric conversion elements. Each processing circuit included in the plurality of processing circuits may process the signals output from the first photoelectric conversion element corresponding to the column and stored in the first memory circuit.

According to a fourth aspect of the present invention, in the first aspect, the solid-state imaging device may further have a first connection layer. The first connection layer is disposed between the first substrate and the second substrate and connects the first substrate and the second substrate to each other. A plurality of microbumps may be disposed in the first connection layer.

According to a fifth aspect of the present invention, in the first aspect, the solid-state imaging device may further have a second connection layer that is disposed between the second substrate and the third substrate and connects the second substrate and the third substrate to each other.

According to a sixth aspect of the present invention, in the first aspect, the second substrate may further have at least one of a reading circuit and a plurality of second photoelectric conversion elements. The reading circuit reads the signals from the plurality of first photoelectric conversion elements. At least one of the reading circuit and the plurality of second photoelectric conversion elements may be disposed in the first area.

According to a seventh aspect of the present invention, in the first aspect, the third substrate may further have one or more second layers and a plurality of second through electrodes. The plurality of second through electrodes penetrate at least one of the second layers.

According to an eighth aspect of the present invention, an imaging apparatus has the solid-state imaging device.

DETAILED DESCRIPTION OF THE INVENTION

With reference to the drawings, embodiments of the present invention will be described.

First Embodiment

Figure 1:
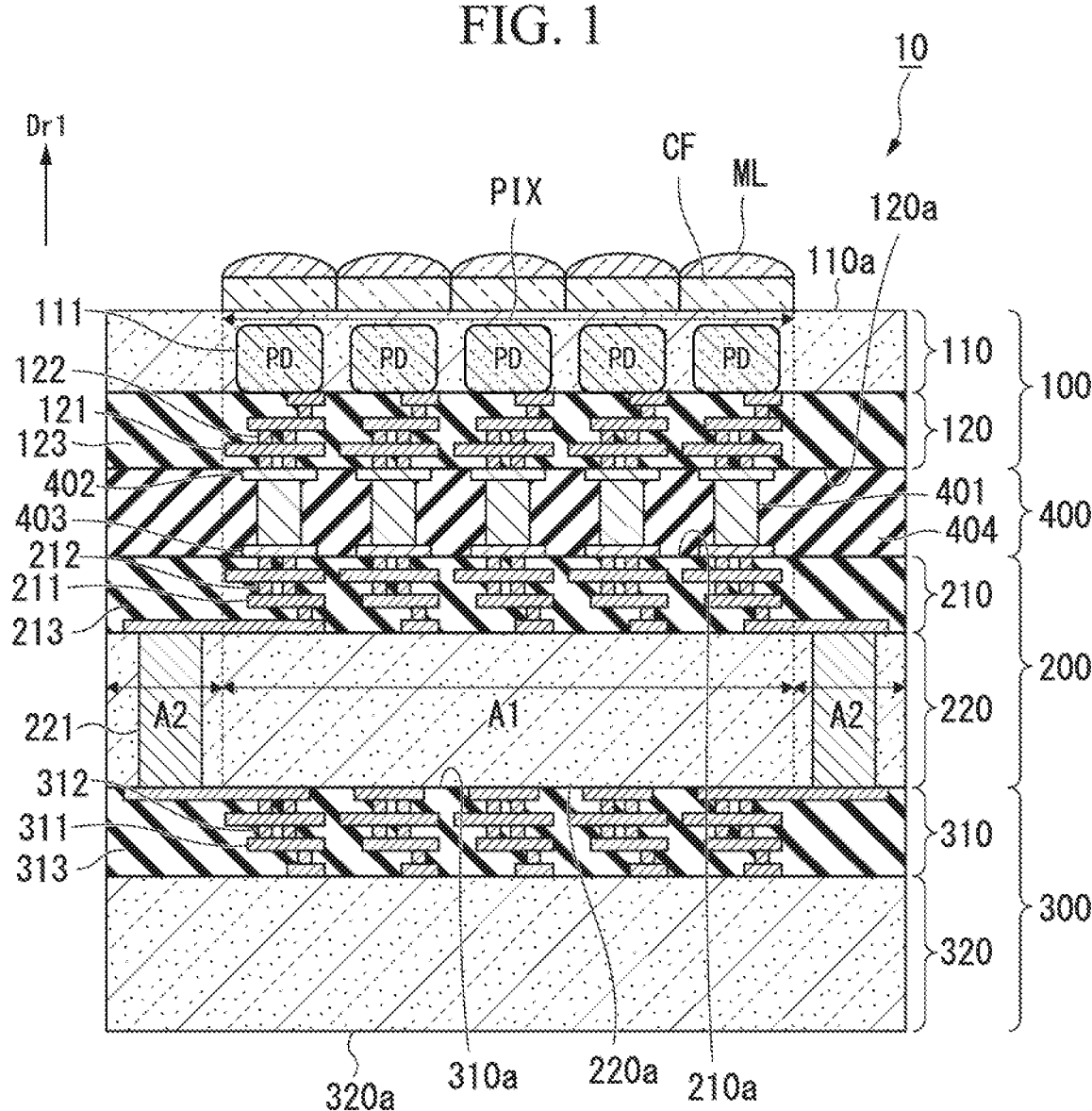
FIG. 1 is a sectional view of a solid-state imaging device according to a first embodiment of the present invention.

FIG. 1 shows a configuration of a solid-state imaging device 10 according to a first embodiment of the present invention. FIG. 1 shows a section of the solid-state imaging device 10. As shown in FIG. 1, the solid-state imaging device 10 has a first substrate 100, a second substrate 200, a third substrate 300, a connection layer 400, a plurality of color filters CF, and a plurality of micro lenses ML. FIG. 1 shows reference numerals of one micro lens ML and one color filter CF as representatives.

Dimensions of parts constituting the solid-state imaging device 10 may not always conform to the dimensions shown in FIG. 1. The dimensions of the parts constituting the solid-state imaging device 10 may be optional. This is the same for dimensions in sectional views other than FIG. 1.

The first substrate 100 has a layer 110 (a semiconductor layer) and a layer 120 (a wiring layer). The layer 110 and the layer 120 are stacked in a thickness direction Dr1 of the first substrate 100. The thickness direction Dr1 of the first substrate 100 is a direction perpendicular to a surface 110a of the layer 110. The layer 110 and the layer 120 are in contact with each other.

The layer 110 is made of a semiconductor material. For example, the semiconductor material includes at least one of silicon (Si) and germanium (Ge). The layer 110 has the surface 110a. The surface 110a is a principal surface of the first substrate 100. The principal surface of the first substrate 100 is a relatively wide surface of a plurality of surfaces constituting the surface of the first substrate 100.

The layer 110 has a plurality of photoelectric conversion elements 111 (photodiodes). FIG. 1 shows a reference numeral of one photoelectric conversion element 111 as a representative. The photoelectric conversion elements 111 constitute a pixel. The photoelectric conversion elements 111 are disposed in a pixel area PIX. For example, the photoelectric conversion element 111 is made of a semiconductor material having an impurity concentration different from that of the semiconductor material constituting the layer 110. The photoelectric conversion element 111 converts light into a signal.

The layer 120 is stacked in the thickness direction Dr1 of the first substrate 100 with respect to the layer 110. The layer 120 has a surface 120a. The surface 120a is in contact with the connection layer 400. The surface 120a is a principal surface of the first substrate 100. The surface 110a and the surface 120a face in opposite directions.

The layer 120 has a plurality of wirings 121, a plurality of vias 122, and an interlayer insulating film 123. FIG. 1 shows reference numerals of one wiring 121 and one via 122 as representatives.

The wiring 121 and the via 122 are made of a conductive material. For example, the conductive material includes a metal such as aluminum (Al) and copper (Cu). The wiring 121 and the via 122 may be made of conductive materials different from each other. The wiring 121 is a thin film having a wiring pattern formed thereon. The wiring 121 transmits the signal generated by the photoelectric conversion element 111. A wiring 121 with only one layer may be disposed or a wiring 121 with a plurality of layers may be disposed. In the example shown in FIG. 1, the wiring 121 with three layers is disposed.

The vias 122 connect the wirings 121 of respective layers to one another. In the layer 120, parts other than the wirings 121 and the vias 122 are made of the interlayer insulating film 123. The interlayer insulating film 123 is made of an insulating material. For example, the insulating material includes silicon dioxide ($SiO_2$).

In FIG. 1, the first substrate 100 has two layers. The first substrate 100 may have only one layer. Alternatively, the first substrate 100 may have three or more layers.

The second substrate 200 has a layer 210 (a wiring layer) and a layer 220 (a semiconductor layer). The layer 210 and the layer 220 are stacked in the thickness direction Dr1 of the first substrate 100. The layer 210 and the layer 220 are in contact with each other.

The layer 210 has a surface 210a. The surface 210a faces the surface 120a. The surface 210a is in contact with the connection layer 400. The surface 210a is a principal surface of the second substrate 200. The principal surface of the second substrate 200 is a relatively wide surface of a plurality of surfaces constituting the surface of the second substrate 200. The layer 210 has a plurality of wirings 211, a plurality of vias 212, and an interlayer insulating film 213. FIG. 1 shows reference numerals of one wiring 211 and one via 212 as representatives.

The wiring 211 and the via 212 are made of a conductive material. The wiring 211 and the via 212 may be made of conductive materials different from each other. The wiring 211 is a thin film having a wiring pattern formed thereon. The wirings 211 transmit signals output from the first substrate 100. A wiring 211 with only one layer may be disposed or a wiring 211 with a plurality of layers may be disposed. In the example shown in FIG. 1, the wiring 211 with three layers is disposed.

The vias 212 connect the wirings 211 of respective layers to one another. In the layer 210, parts other than the wirings 211 and the vias 212 are made of the interlayer insulating film 213. The interlayer insulating film 213 is made of an insulating material.

The layer 220 is stacked on the layer 210 in the thickness direction Dr1 of the first substrate 100. The layer 220 is made of a semiconductor material. The layer 220 has a surface 220a. The surface 220a is in contact with the third substrate 300. The surface 220a is a principal surface of the second substrate 200. The surface 210a and the surface 220a face in opposite directions.

The layer 220 has a plurality of through electrodes 221. FIG. 1 shows a reference numeral of one through electrode 221 as a representative. The through electrode 221 is made of a conductive material. The through electrodes 221 penetrate the layer 220. The through electrodes 221 are in contact with the wirings 211. The through electrodes 221 may penetrate the layer 210 and the layer 220. It is sufficient if the through electrodes 221 penetrate one or more layers of the second substrate 200. The through electrodes 221 are disposed in an area A2 different from an area A1 corresponding to the pixel area PIX. When the solid-state imaging device 10 is viewed in a direction perpendicular to the surface 110a, that is, the thickness direction Dr1 of the first substrate 100, the plurality of photoelectric conversion elements 111 and the area A1 overlap each other. The through electrodes 221 are not disposed in the area A1. The through electrodes 221 penetrate the layer 220 that is in contact with the third substrate 300, thereby electrically connecting the second substrate 200 and the third substrate 300 to each other. The through electrodes 221 transmit signals, which have been input to the second substrate 200, to the third substrate 300.

In FIG. 1, the second substrate 200 has two layers. The second substrate 200 may have only one layer. Alternatively, the second substrate 200 may have three or more layers.

The third substrate 300 has a layer 310 (a wiring layer) and a layer 320 (a semiconductor layer). The layer 310 and the layer 320 are stacked in the thickness direction Dr1 of the first substrate 100. The layer 310 and the layer 320 are in contact with each other.

The layer 310 has a surface 310a. The surface 310a faces the surface 220a. The surface 310a is in contact with the second substrate 200. The surface 310a is a principal surface of the third substrate 300. The principal surface of the third substrate 300 is a relatively wide surface of a plurality of surfaces constituting the surface of the third substrate 300. The layer 310 has a plurality of wirings 311, a plurality of vias 312, and an interlayer insulating film 313. FIG. 1 shows reference numerals of one wiring 311 and one via 312 as representatives.

The wiring 311 and the via 312 are made of a conductive material. The wiring 311 and the via 312 may be made of conductive materials different from each other. The wiring 311 is a thin film having a wiring pattern formed thereon. The wirings 311 are in contact with the through electrodes 221. The wirings 311 transmit signals output from the second substrate 200. A wiring 311 with only one layer may be disposed or a wiring 311 with a plurality of layers may be disposed. In the example shown in FIG. 1, the wiring 311 of four is disposed.

The vias 312 connect the wirings 311 of respective layers to one another. In the layer 310, parts other than the wirings 311 and the vias 312 are made of the interlayer insulating film 313. The interlayer insulating film 313 is made of an insulating material.

The layer 320 is stacked on the layer 310 in the thickness direction Dr1 of the first substrate 100. The layer 320 is made of a semiconductor material. The layer 320 has a surface 320a. The surface 320a is a principal surface of the third substrate 300. The surface 310a and the surface 320a face in opposite directions.

In FIG. 1, the third substrate 300 has two layers. The third substrate 300 may have only one layer. Alternatively, the third substrate 300 may have three or more layers.

The connection layer 400 is disposed between the first substrate 100 and the second substrate 200. The connection layer 400 has microbumps 401, pads 402, pads 403, and a resin layer 404. FIG. 1 shows reference numerals of one microbump 401, one pad 402, and one pad 403 as representatives. The microbump 401, the pad 402, and the pad 403 are made of a conductive material. For example, the conductive material constituting the microbump 401, the pad 402, and the pad 403 includes a metal such as gold (Au), aluminum (Al) and copper (Cu).

The pads 402 are in contact with the vias 122 on the surface 120a. Therefore, the pads 402 are electrically connected to the first substrate 100. The pads 403 are in contact with the vias 212 on the surface 210a. Therefore, the pads 403 are electrically connected to the second substrate 200. The microbumps 401 are disposed between the pad 402 and the pad 403. The microbumps 401 are in contact with the pads 402 and the pads 403. The microbumps 401, the pads 402, and the pads 403 electrically connect the first substrate 100 and the second substrate 200 to each other. The microbumps 401, the pads 402, and the pads 403 transmit signals, which have been output from the first substrate 100, to the second substrate 200.

In the connection layer 400, parts other than the microbumps 401, the pads 402, and the pads 403 are made of the resin layer 404. The resin layer 404 is made of a resin material.

The color filters CF are disposed on the surface 110a. The micro lenses ML are stacked on the color filters CF.

Light from an object, which has passed through an imaging lens optically disposed in front of the solid-state imaging device 10, is incident on the micro lenses ML. The micro lenses ML form an image of the light having passed through the imaging lens. The color filters CF are disposed in an area corresponding to the micro lenses ML. That is, the color filters CF are disposed in an area through which the light having passed through the micro lenses ML passes. The light having passed through the micro lenses ML is incident on the color filters CF. The color filters CF allow light in a specific wavelength range to pass therethrough.

The light having passed through the color filters CF is incident on the layer 110. In the layer 110, the photoelectric conversion elements 111 are disposed in an area corresponding to the micro lenses ML. That is, the photoelectric conversion elements 111 are disposed in the area through which the light having passed through the micro lenses ML passes. The light incident on the layer 110 is incident on the photoelectric conversion elements 111. The photoelectric conversion elements 111 convert the incident light into signals.

The signals output from the photoelectric conversion elements 111 are transmitted to the connection layer 400 by the wirings 121 and the vias 122. The signals transmitted to the connection layer 400 are transmitted to the second substrate 200 by the microbumps 401, the pads 402, and the pads 403. The signals transmitted to the second substrate 200 are transmitted to the third substrate 300 by the wirings 211, the vias 212, and the through electrodes 221.

Figure 2:
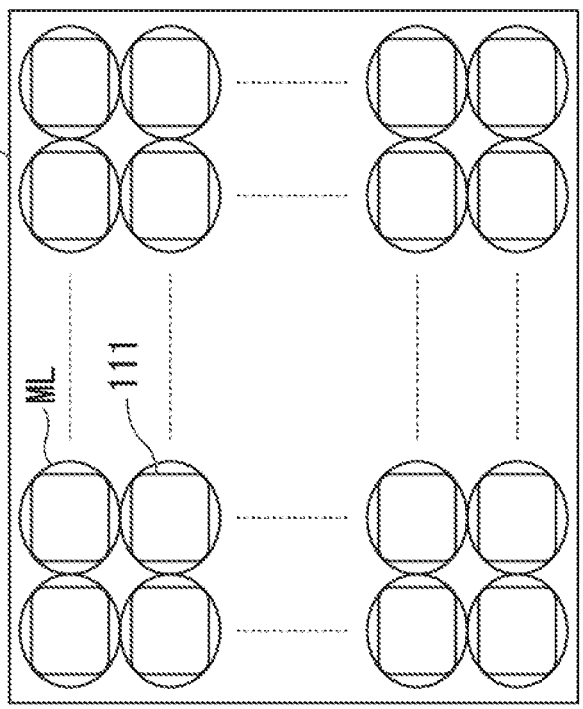
FIG. 2 is a plan view of a first substrate according to the first embodiment of the present invention.

FIG. 2 is a plan view of the first substrate 100. FIG. 2 shows an arrangement of each element when the first substrate 100 is viewed in the direction perpendicular to the surface 110a. That is, FIG. 2 shows the arrangement of each element when the first substrate 100 is viewed from the front of the first substrate 100. FIG. 2 shows reference numerals of one micro lens ML and one photoelectric conversion element 111 as representatives. FIG. 2 does not show a part of the photoelectric conversion elements 111 and a part of the micro lenses ML. FIG. 2 shows the photoelectric conversion elements 111 in a transparent manner. FIG. 2 does not show the color filters CF.

The plurality of photoelectric conversion elements 111 and the plurality of micro lenses ML are disposed in a matrix form. When the first substrate 100 is viewed in the direction perpendicular to the surface 100a, each photoelectric conversion element 111 included in the plurality of photoelectric conversion elements 111 overlaps any one of the plurality of micro lenses ML. One photoelectric conversion element 111 and one micro lens ML correspond to each other. When the first substrate 100 is viewed in the direction perpendicular to the surface 110a, the center of the photoelectric conversion element 111 and the center of the micro lens ML coincide with each other. The plurality of photoelectric conversion elements 111 and the plurality of micro lenses ML are disposed in the pixel area PIX. The pixel area PIX is disposed at the center of the first substrate 100.

Figure 3:
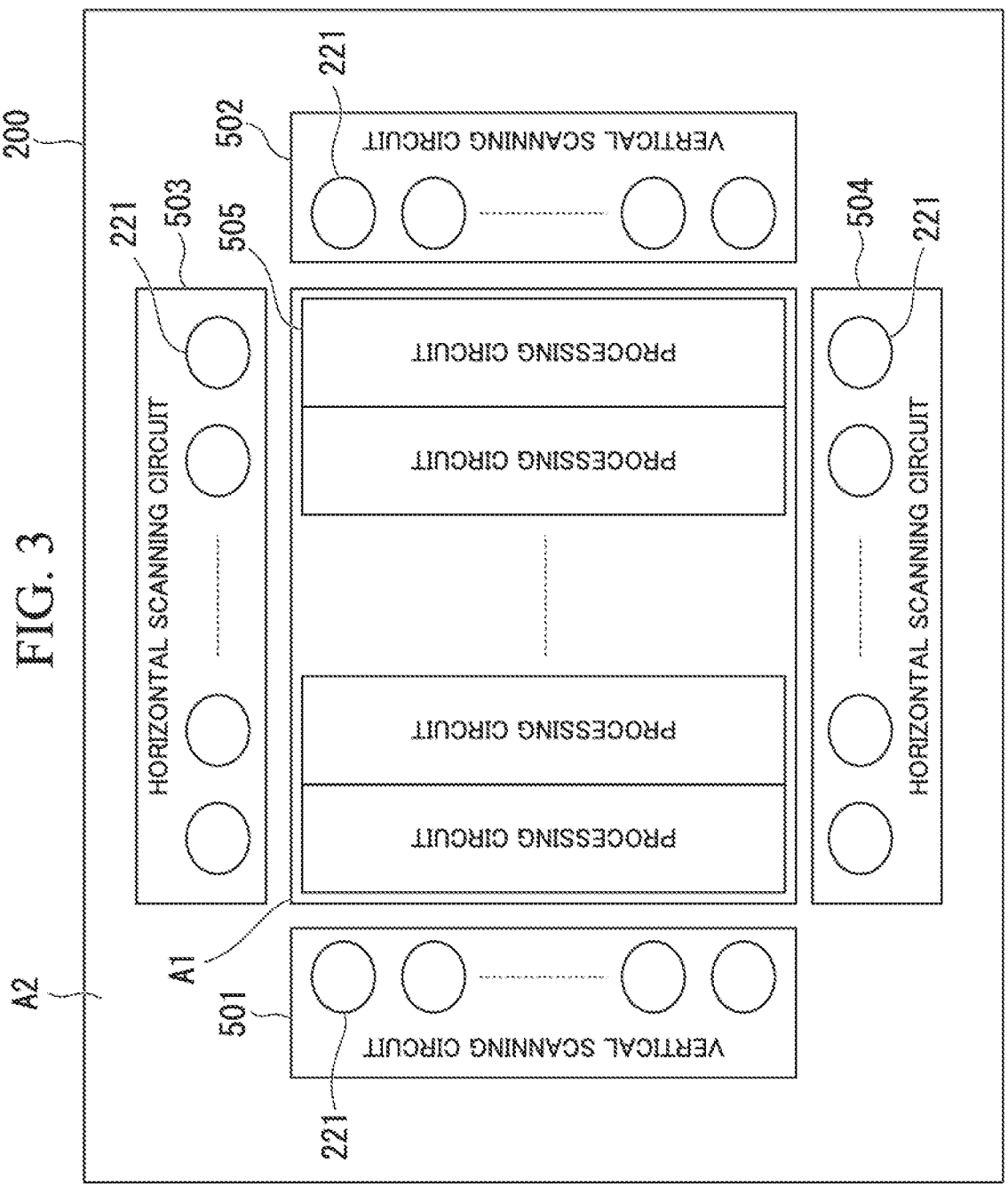
FIG. 3 is a plan view of a second substrate according to the first embodiment of the present invention.

FIG. 3 is a plan view of the second substrate 200. FIG. 3 shows an arrangement of each element when the second substrate 200 is viewed in a direction perpendicular to the surface 210a. That is. FIG. 3 shows the arrangement of each element when the second substrate 200 is viewed from the front of the second substrate 200. As shown in FIG. 3, the second substrate 200 has the plurality of through electrodes 221, a vertical scanning circuit 501, a vertical scanning circuit 502, a horizontal scanning circuit 503, a horizontal scanning circuit 504, and a plurality of processing circuits 505. FIG. 3 shows reference numerals of one through electrode 221 and one processing circuit 505 as representatives. FIG. 3 does not show a part of the through electrodes 221 and a part of the processing circuits 505. FIG. 3 transparently shows each element.

The plurality of processing circuits 505 are disposed in the area A1. The area A1 is disposed at a position corresponding to the pixel area PIX. When the solid-state imaging device 10 is viewed in the direction perpendicular to the surface 110a, that is, the thickness direction Dr1 of the first substrate 100, the pixel area PIX and the area A1 overlap each other. The area A1 is disposed at the center of the second substrate 200.

Each processing circuit 505 included in the plurality of processing circuits 505 is disposed for each column in the arrangement of the plurality of photoelectric conversion elements 111. The plurality of processing circuits 505 process signals output from the plurality of photoelectric conversion elements 111. For example, the processing circuits 505 are AD conversion circuits that perform analog-to-digital conversion on signals read from the plurality of photoelectric conversion elements 111. The processing circuits 505 may be noise elimination circuits that eliminate noise included in the signals read from the plurality of photoelectric conversion elements 111. The processing circuits 505 may be amplification circuits that amplify the signals read from the plurality of photoelectric conversion elements 111. Each microbump 401 included in the plurality of microbumps 401 not shown in FIG. 3 is disposed for each photoelectric conversion element 111. The signal output from each respective photoelectric conversion element 111 is transmitted to the second substrate 200 via any one of the plurality of microbumps 401.

The vertical scanning circuit 501, the vertical scanning circuit 502, the horizontal scanning circuit 503, and the horizontal scanning circuit 504 are disposed in the area A2. The vertical scanning circuit 501 and the vertical scanning circuit 502 are adjacent to the area A1 in a row direction in the arrangement of the plurality of photoelectric conversion elements 111. The horizontal scanning circuit 503 and the horizontal scanning circuit 504 are adjacent to the area A1 in a column direction in the arrangement of the plurality of photoelectric conversion elements 111. The vertical scanning circuit 501 and the vertical scanning circuit 502 control a plurality of pixels, which include the photoelectric conversion elements 111, in each row. The vertical scanning circuit 501 and the vertical scanning circuit 502 generate control signals for performing this control and output the control signals to the plurality of pixels. The horizontal scanning circuit 503 and the horizontal scanning circuit 504 perform control for outputting signals, which have been processed by the processing circuits 505, in each column from the processing circuits 505.

The plurality of through electrodes 221 are disposed only in the area A2 different from the area A1. The area A2 surrounds the area A1. Each through electrode 221 included in the plurality of through electrodes 221 is disposed in an area, where any one of the vertical scanning circuit 501, the vertical scanning circuit 502, the horizontal scanning circuit 503, and the horizontal scanning circuit 504 is disposed, in the area A2. Each through electrode 221 included in the plurality of through electrodes 221 is disposed for each row and each column in the arrangement of the plurality of photoelectric conversion elements 111.

Figure 4:
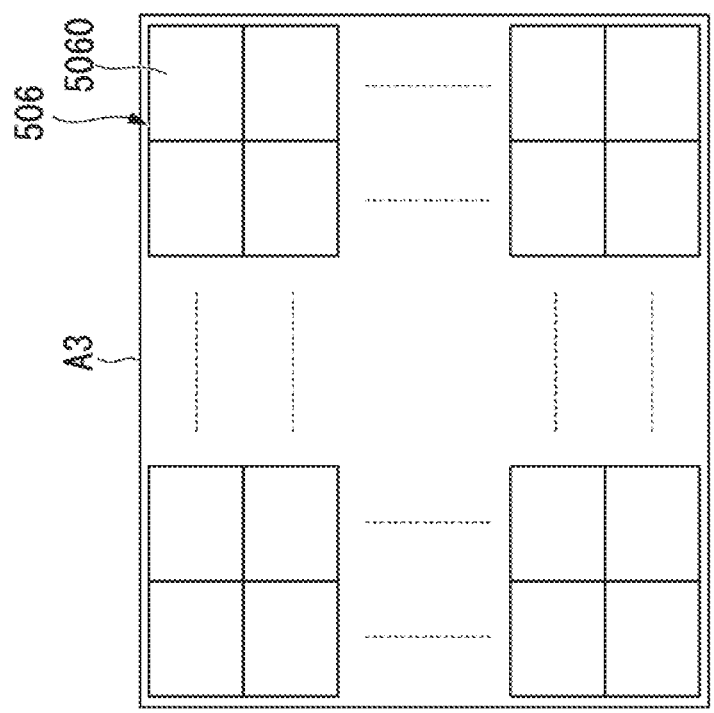
FIG. 4 is a plan view of a third substrate according to the first embodiment of the present invention.

FIG. 4 is a plan view of the third substrate 300. FIG. 4 shows an arrangement of each element when the third substrate 300 is viewed in a direction perpendicular to the surface 310a. That is, FIG. 4 shows the arrangement of each element when the third substrate 300 is viewed from the front of the third substrate 300. As shown in FIG. 4, the third substrate 300 has a memory circuit 506. FIG. 4 transparently shows the memory circuit 506.

The memory circuit 506 is disposed in an area A3. The area A3 is disposed at a position corresponding to the pixel area PIX. When the solid-state imaging device 10 is viewed in the direction perpendicular to the surface 310a, that is, the thickness direction Dr1 of the first substrate 100, the pixel area PIX and the area A3 overlap each other. The area A3 is disposed at the center of the third substrate 300. The memory circuit 506 stores signals processed by the processing circuits 505. The memory circuit 506 has a plurality of memory areas 5060. FIG. 4 shows a reference numeral of one memory area 5060 as a representative. Each memory 5060 included in the plurality of memory areas 5060 is disposed for each photoelectric conversion element 111. One memory area 5060 corresponds to one photoelectric conversion element 111. The memory areas 5060 store signals corresponding to signals output from the photoelectric conversion elements 111.

The third substrate 300 may have an image processing circuit that processes the signals stored in the memory circuit 506. For example, the image processing circuit converts the signals stored in the memory circuit 506 into image data. The image processing circuit may correct the image data. The image processing circuit may also compress the image data.

Figure 5:
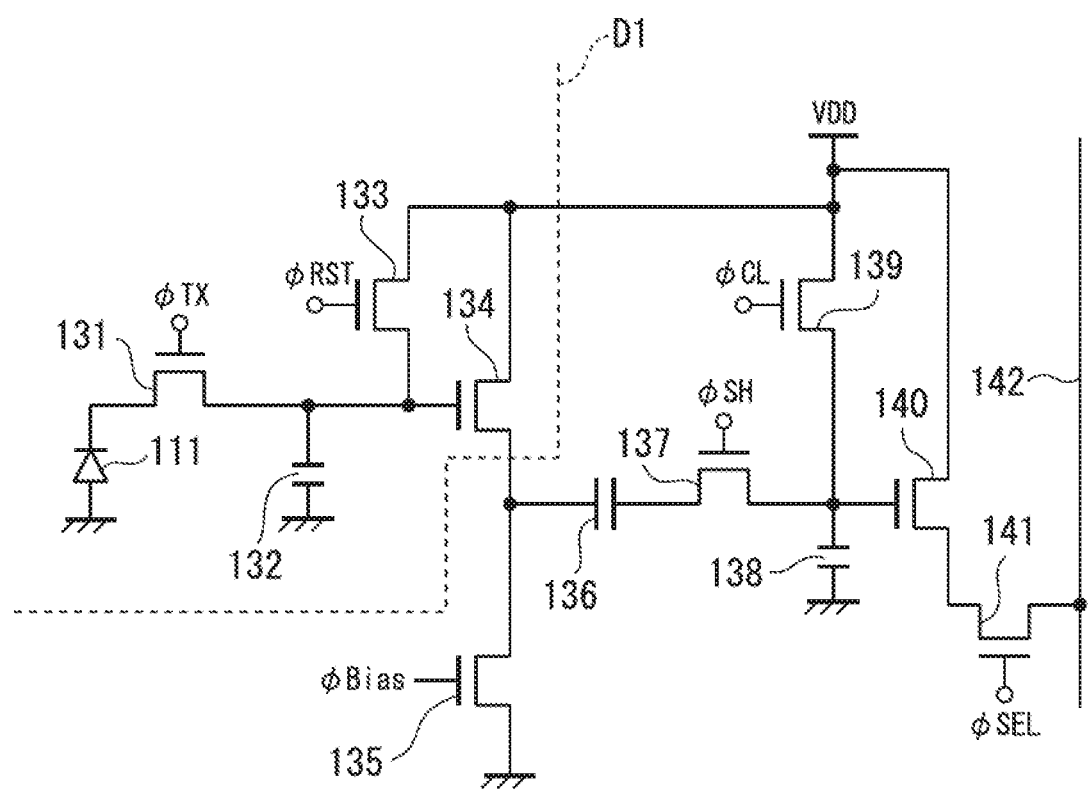
FIG. 5 is a circuit diagram of a pixel according to the first embodiment of the present invention.

The solid-state imaging device 10 has a plurality of pixels. FIG. 5 shows a configuration of one pixel. The pixel has the photoelectric conversion element 111, a transfer transistor 131, a floating diffusion 132, a reset transistor 133, an amplification transistor 134, a current source 135, a clamp capacitor 136, a sample-and-hold transistor 137, a memory 138, a clamp transistor 139, an amplification transistor 140, and a selection transistor 141. Hereinafter, the floating diffusion 132 is written as an FD 132.

A first end of the photoelectric conversion element 111 is connected to the ground. A drain of the transfer transistor 131 is connected to a second end of the photoelectric conversion element 111. A gate of the transfer transistor 131 is connected to the vertical scanning circuit 501 or the vertical scanning circuit 502. A control signal φTX is supplied to the gate of the transfer transistor 131 from the vertical scanning circuit 501 or the vertical scanning circuit 502.

A first end of the FD 132 is connected to a source of the transfer transistor 131. A second end of the FD 132 is connected to the ground. A drain of the reset transistor 133 is connected to a power source that supplies a power supply voltage VDD. A source of the reset transistor 133 is connected to the source of the transfer transistor 131. A gate of the reset transistor 133 is connected to the vertical scanning circuit 501 or the vertical scanning circuit 502. A control signal φRST is supplied to the gate of the reset transistor 133 from the vertical scanning circuit 501 or the vertical scanning circuit 502.

A drain of the amplification transistor 134 is connected to the power source that supplies the power supply voltage VDD. A gate of the amplification transistor 134 is connected to the source of the transfer transistor 131. A first end of the current source 135 is connected to a source of the amplification transistor 134. A second end of the current source 135 is connected to the ground. A first end of the clamp capacitor 136 is connected to the source of the amplification transistor 134 and the first end of the current source 135.

A drain of the sample-and-hold transistor 137 is connected to a second end of the clamp capacitor 136. A gate of the sample-and-hold transistor 137 is connected to the vertical scanning circuit 501 or the vertical scanning circuit 502. A control signal φSH is supplied to the gate of the sample-and-hold transistor 137 from the vertical scanning circuit 501 or the vertical scanning circuit 502. A drain of the clamp transistor 139 is connected to the power source that supplies the power supply voltage VDD. A source of the clamp transistor 139 is connected to a source of the sample-and-hold transistor 137. A gate of the clamp transistor 139 is connected to the vertical scanning circuit 501 or the vertical scanning circuit 502. A control signal φCL is supplied to the gate of the clamp transistor 139 from the vertical scanning circuit 501 or the vertical scanning circuit 502.

A first end of the memory 138 is connected to the source of the sample-and-hold transistor 137. A second end of the memory 138 is connected to the ground. A drain of the amplification transistor 140 is connected to the power source that supplies the power supply voltage VDD. A gate of the amplification transistor 140 is connected to the source of the sample-and-hold transistor 137. A drain of the selection transistor 141 is connected to a source of the amplification transistor 140. A source of the selection transistor 141 is connected to a vertical signal line 142. A gate of the selection transistor 141 is connected to the vertical scanning circuit 501 or the vertical scanning circuit 502. A control signal φSEL is supplied to the gate of the selection transistor 141 from the vertical scanning circuit 501 or the vertical scanning circuit 502.

The photoelectric conversion element 111 is a photodiode. The photoelectric conversion element 111 performs imaging and outputs a first signal. Specifically, the photoelectric conversion element 111 generates charge based on the amount of light incident on the photoelectric conversion element 111 and accumulates the generated charge. The photoelectric conversion element 111 outputs the charge as the first signal.

The transfer transistor 131 is connected to the photoelectric conversion element 111 and the FD 132. The transfer transistor 131 switches between a state in which the photoelectric conversion element 111 and the FD 132 are electrically connected to each other and a state in which the photoelectric conversion element 111 and the FD 132 are electrically isolated from each other. When the transfer transistor 131 is turned on, the photoelectric conversion element 111 and the FD 132 are electrically connected to each other. When the transfer transistor 131 is turned off, the photoelectric conversion element 111 and the FD 132 are electrically isolated from each other. When the photoelectric conversion element 111 and the FD 132 are electrically connected to each other, the transfer transistor 131 transmits the charge accumulated in the photoelectric conversion element 111 to the FD) 132. Turning-on and turning-off of the transfer transistor 131 are controlled by the control signal φTX from the vertical scanning circuit 501 or the vertical scanning circuit 502.

The FD 132 holds a voltage based on the charge output from the photoelectric conversion element 111. That is, the FD 132 holds the first signal output from the photoelectric conversion element 111 as a voltage.

The reset transistor 133 is connected to the power source and the FD 132. The reset transistor 133 switches between a state in which the power source and the FD 132 are electrically connected to each other and a state in which the power source and the FD 132 are electrically isolated from each other. When the reset transistor 133 is turned on, the power source and the FD 132 are electrically connected to each other. When the reset transistor 133 is turned off, the power source and the FD 132 are electrically isolated from each other. When the power source and the FD 132 are electrically connected to each other, the reset transistor 133 resets the FD 132. Turning-on and turning-off of the reset transistor 133 are controlled by the control signal φRST from the vertical scanning circuit 501 or the vertical scanning circuit 502. When the transfer transistor 131 and the reset transistor 133 are turned on, the photoelectric conversion element 111 is reset. When the photoelectric conversion element 111 and the FD 132 are reset, the amount of charge accumulated in the photoelectric conversion element 111 and the FD 132 is controlled. Due to this resetting, the state (the potential) of the photoelectric conversion element 111 and the FD 132 is set to a reference state (a reference potential and a reset level).

The amplification transistor 134 amplifies the voltage based on the charge held in the FD 132 and outputs the amplified voltage as a second signal from the source thereof. The current source 135 serves as a load of the amplification transistor 134 and supplies a current for driving the amplification transistor 134 to the amplification transistor 134. The amplification transistor 134 and the current source 135 constitute a source follower circuit.

The clamp capacitor 136 clamps (fixes) a voltage level of the second signal output from the amplification transistor 134. The sample-and-hold transistor 137 is connected to the clamp capacitor 136 and the memory 138. The sample-and-hold transistor 137 switches between a state in which the clamp capacitor 136 and the memory 138 are electrically connected to each other and a state in which the clamp capacitor 136 and the memory 138 are electrically isolated from each other. When the sample-and-hold transistor 137 is turned on, the clamp capacitor 136 and the memory 138 are electrically connected to each other. When the sample-and-hold transistor 137 is turned off, the clamp capacitor 136 and the memory 138 are electrically isolated from each other. When the clamp capacitor 136 and the memory 138 are electrically connected to each other, the sample-and-hold transistor 137 samples the voltage of the second end of the clamp capacitor 136. By so doing, the sample-and-hold transistor 137 transmits the second signal output from the amplification transistor 134 to the memory 138. Turning-on and turning-off of the sample-and-hold transistor 137 are controlled by the control signal φSH from the vertical scanning circuit 501 or the vertical scanning circuit 502. The memory 138 holds the second signal sampled by the sample-and-hold transistor 137.

The clamp transistor 139 is connected to the power source and the memory 138. The clamp transistor 139 switches between a state in which the power source and the memory 138 are electrically connected to each other and a state in which the power source and the memory 138 are electrically isolated from each other. When the clamp transistor 139 is turned on, the power source and the memory 138 are electrically connected to each other. When the clamp transistor 139 is turned off, the power source and the memory 138 are electrically isolated from each other. When the power source and the memory 138 are electrically connected to each other, the clamp transistor 139 resets the memory 138. Turning-on and turning-off of the clamp transistor 139 are controlled by the control signal φCL from the vertical scanning circuit 501 or the vertical scanning circuit 502. When the sample-and-hold transistor 137 and the clamp transistor 139 are turned on, the clamp capacitor 136 is reset. When the clamp capacitor 136 and the memory 138 are reset, the amount of charge accumulated in the clamp capacitor 136 and the memory 138 is controlled. Due to this resetting, the state (the potential) of the clamp capacitor 136 and the memory 138 is set to a reference state (a reference potential and a reset level).

The amplification transistor 140 amplifies a voltage based on the second signal held in the memory 138 and outputs the amplified voltage as a third signal from the source thereof. A current source connected to the vertical signal line 142 serves as a load of the amplification transistor 140 and supplies a current for driving the amplification transistor 140 to the amplification transistor 140. The amplification transistor 140 and the current source constitute a source follower circuit.

The selection transistor 141 is connected to the amplification transistor 140 and the vertical signal line 142. The selection transistor 141 switches between a state in which the amplification transistor 140 and the vertical signal line 142 are electrically connected to each other and a state in which the amplification transistor 140 and the vertical signal line 142 are electrically isolated from each other. When the selection transistor 141 is turned on, the amplification transistor 140 and the vertical signal line 142 are electrically connected to each other. When the selection transistor 141 is turned off, the amplification transistor 140 and the vertical signal line 142 are electrically isolated from each other. When the amplification transistor 140 and the vertical signal line 142 are electrically connected to each other, the selection transistor 141 outputs the third signal output from the amplification transistor 140 to the vertical signal line 142. Turning-on and turning-off of the selection transistor 141 are controlled by the control signal φSEL from the vertical scanning circuit 501 or the vertical scanning circuit 502.

A plurality of vertical signal lines 142 are disposed. Each vertical signal line 142 included in the vertical signal lines 142 is disposed for each column in the arrangement of the plurality of pixels. The plurality of vertical signal lines 142 extend in a column direction. Each vertical signal line 142 included in the plurality of vertical signal lines 142 is connected to pixels of each column in the arrangement of the plurality of pixels. The vertical signal lines 142 are connected to the processing circuits 505. Signals output to the vertical signal lines 142 from each pixel are transmitted to the processing circuits 505 by the vertical signal lines 142.

At least a part of the transfer transistor 131, the floating diffusion 132, the amplification transistor 134, the current source 135, the clamp capacitor 136, the sample-and-hold transistor 137, the memory 138, the amplification transistor 140, and the selection transistor 141 constitute a reading circuit. The reading circuit reads signals from the plurality of photoelectric conversion elements 111.

FIG. 5 shows a boundary D1 between the first substrate 100 and the second substrate 200. The photoelectric conversion element 111, the transfer transistor 131, the floating diffusion 132, the reset transistor 133, and the amplification transistor 134 are disposed in the first substrate 100. The current source 135, the clamp capacitor 136, the sample-and-hold transistor 137, the memory 138, the clamp transistor 139, the amplification transistor 140, and the selection transistor 141 are disposed in the second substrate 200. Among the elements shown in FIG. 5, the elements included in the first substrate 100 are disposed in the pixel area PIX. Among the elements shown in FIG. 5, the elements included in the second substrate 200 are disposed in the area A1.

The boundary D1 is not limited to the position shown in FIG. 5. For example, the boundary D1 may be disposed between the source of the transfer transistor 131 and the first end of the FD 132. The boundary D1 may also be disposed between the second end of the clamp capacitor 136 and the drain of the sample-and-hold transistor 137. The boundary D1 may also be disposed between the source of the sample-and-hold transistor 137 and the first end of the memory 138.

As described above, the solid-state imaging device 10 has the first substrate 100, the second substrate 200, the third substrate 300, and the plurality of microbumps 401. The first substrate 100 has the surface 110a (a first principal surface), the surface 120a (a second principal surface), and the plurality of photoelectric conversion elements 111 (first photoelectric conversion elements). The surface 110a and the surface 120a face in opposite directions. The plurality of photoelectric conversion elements 111I are disposed in a matrix form. The second substrate 200 has the surface 210a (a third principal surface), the surface 220a (a fourth principal surface), one or more first layers (the layer 210 and the layer 220), and the plurality of through electrodes 221 (first through electrodes). The surface 210a and the surface 220a face in opposite directions. The surface 210a faces the surface 120a. The plurality of through electrodes 221 penetrate at least one of the one or more first layers. The third substrate 300 has the surface 310a (a fifth principal surface) and the surface 320a (a sixth principal surface). The surface 310a and the surface 320a face in opposite directions. The surface 310a faces the surface 220a. The plurality of microbumps 401 are disposed between the surface 120a and the surface 210a and electrically connect the first substrate 100 and the second substrate 200 to each other. In the first substrate 100, the plurality of photoelectric conversion elements 111 are disposed in the pixel area PIX. In the second substrate 200, the plurality of through electrodes 221 are disposed only in the area A2 (a second area) different from the area A1 (a first area) corresponding to the pixel area PIX.

The second substrate 200 has the memory 138 (a first memory circuit) and the processing circuits 505. The memory 138 temporarily stores signals output from the plurality of photoelectric conversion elements 111. The processing circuits 505 process the signals stored in the memory 138. The third substrate 300 has the memory circuit 506 (a second memory circuit) that stores the signals processed by the processing circuits 505.

Each microbump 401 included in the plurality of microbumps 401 is disposed for each photoelectric conversion element 111 and electrically connects the photoelectric conversion elements 111 and the memory 138 to each other.

The second substrate 200 has the plurality of processing circuits 505. Each processing circuit 505 included in the plurality of processing circuits 505 is disposed for each column in the arrangement of the plurality of photoelectric conversion elements 111. Each processing circuit 505 included in the plurality of processing circuits 505 processes the signals output from the photoelectric conversion elements 111 corresponding to the columns and stored in the memory 138.

The solid-state imaging device 10 has the connection layer 400 (a first connection layer). The connection layer 400 is disposed between the first substrate 100 and the second substrate 200 and connects the first substrate 100 and the second substrate 200 to each other. The plurality of microbumps 401 are disposed in the connection layer 400.

The second substrate 200 has at least one of the reading circuit, the memory 138, and the processing circuits 505. The reading circuit reads the signals from the plurality of photoelectric conversion elements 111. The memory 138 temporarily stores the signals output from the plurality of photoelectric conversion elements 111. The processing circuits 505 process the signals output from the plurality of photoelectric conversion elements 111. At least one of the reading circuit, the memory 138, and the processing circuits 505 is disposed in the area A1.

The solid-state imaging device 10 may further have a second connection layer. The second connection layer is disposed between the second substrate 200 and the third substrate 300 and connects the second substrate 200 and the third substrate 300 to each other.

The solid-state imaging device of each aspect of the present invention need not have a configuration corresponding to at least one of the resin layer 404, the micro lenses ML, and the color filters CF. The solid-state imaging device of each aspect of the present invention need not have a configuration corresponding to at least one of the vertical scanning circuit 501, the vertical scanning circuit 502, the horizontal scanning circuit 503, the horizontal scanning circuit 504, the plurality of processing circuits 505, and the memory circuit 506. The solid-state imaging device of each aspect of the present invention need not have a configuration corresponding to the reading circuit.

In the solid-state imaging device 10 of the first embodiment, the plurality of through electrodes 221 are disposed only in the area A2 different from the area A1 corresponding to the pixel area PIX. Therefore, an influence on the characteristics of the circuits disposed in the area A1 from the plurality of through electrodes 221 is reduced.

First Modification Example of First Embodiment

Figure 6:
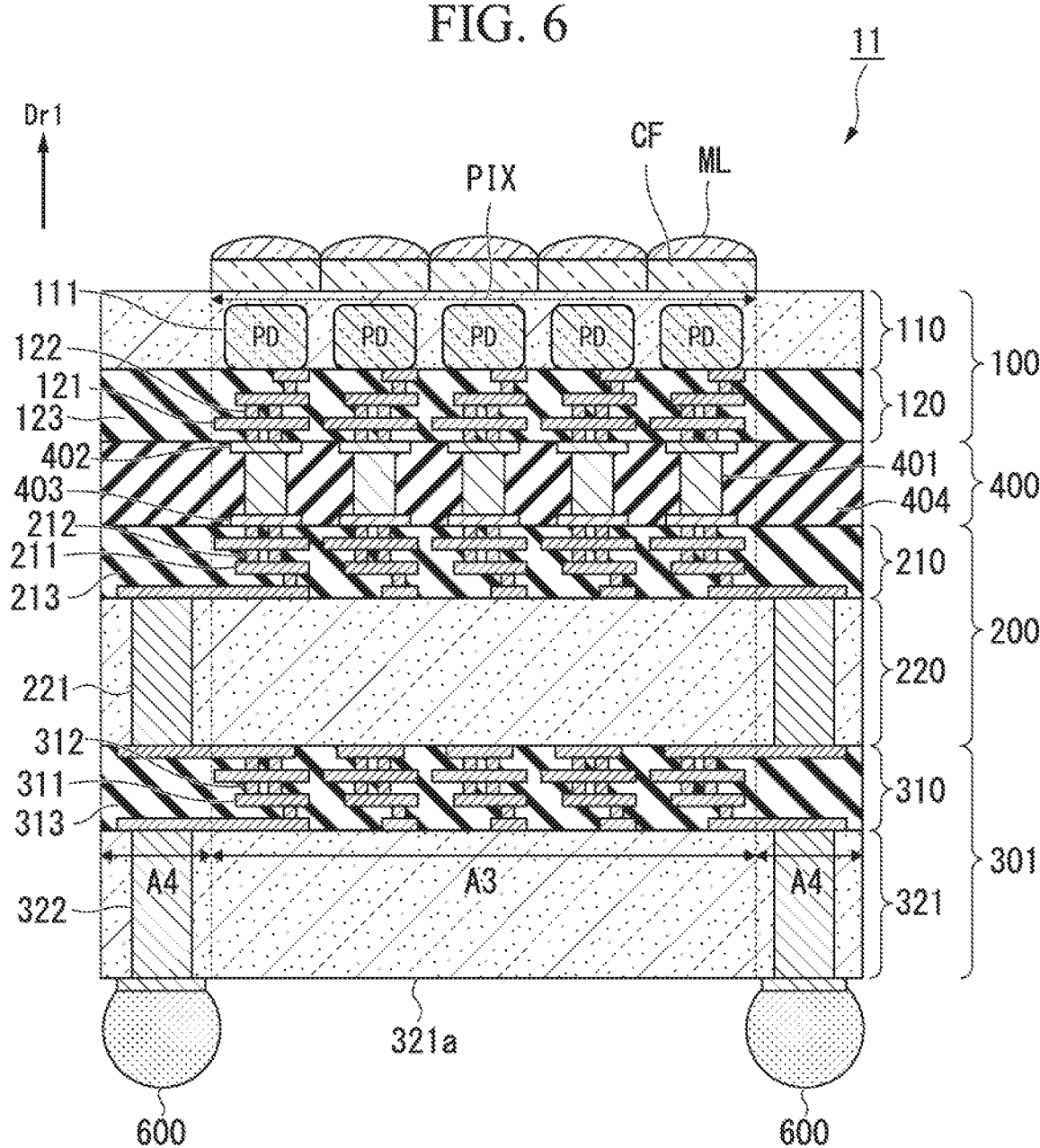
FIG. 6 is a sectional view of a solid-state imaging device according to a first modification example of the first embodiment of the present invention.

FIG. 6 shows a configuration of a solid-state imaging device 1 according to a first modification example of the first embodiment. FIG. 6 shows a section of the solid-state imaging device 11. The configuration shown in FIG. 6 will be described while focusing on the difference with that shown in FIG. 1.

In the solid-state imaging device 11 shown in FIG. 6, the third substrate 300 in the solid-state imaging device 10 shown in FIG. 1 is changed to a third substrate 301. In the third substrate 301, the layer 320 of the third substrate 300 is changed to a layer 321. The layer 321 will be described while focusing on the difference with the layer 320.

The layer 321 has a surface 321a. The surface 321a is a principal surface of the third substrate 301. The surface 310a and the surface 321a face in opposite directions.

The layer 321 has a plurality of through electrodes 322. FIG. 6 shows a reference numeral of one through electrode 322 as a representative. The through electrode 322 is made of a conductive material. The through electrodes 322 penetrate the layer 321. The through electrodes 322 are in contact with wirings 311. The through electrodes 322 may penetrate the layer 310 and the layer 321. It is sufficient if the through electrodes 322 penetrate one or more layers of the third substrate 301. The through electrodes 322 are disposed in an area A4 different from the area A3 corresponding to the pixel area PIX. When the solid-state imaging device 11 is viewed in the thickness direction Dr1 of the first substrate 100, the plurality of photoelectric conversion elements 111 and the area A3 overlap each other. The through electrodes 322 are not disposed in the area A3.

The solid-state imaging device 11 has a plurality of solder bumps 600. The solder bumps 600 are disposed on the surface 321a. The solder bumps 600 are electrically connected to the through electrodes 322. The through electrodes 322 transmit signals input to the third substrate 301 to the solder bumps 600. The solder bumps 600 are electrically connected to external packages.

Other than the above, the configuration shown in FIG. 6 is the same as that shown in FIG. 1.

As described above, the third substrate 301 has one or more second layers (the layer 310 and the layer 321) and the plurality of through electrodes 322 (second through electrodes). The plurality of through electrodes 322 penetrate at least one of the one or more second layers.

The plurality of through electrodes 322 are disposed only in the area A4 different from the area A3 corresponding to the pixel area PIX. Therefore, an influence on the characteristics of the circuits disposed in the area A3 from the plurality of through electrodes 322 is reduced.

The solder bumps 600 are disposed so that the solid-state imaging device 11 can output signals to external circuits of the solid-state imaging device 11.

Second Modification Example of First Embodiment

Figure 7:
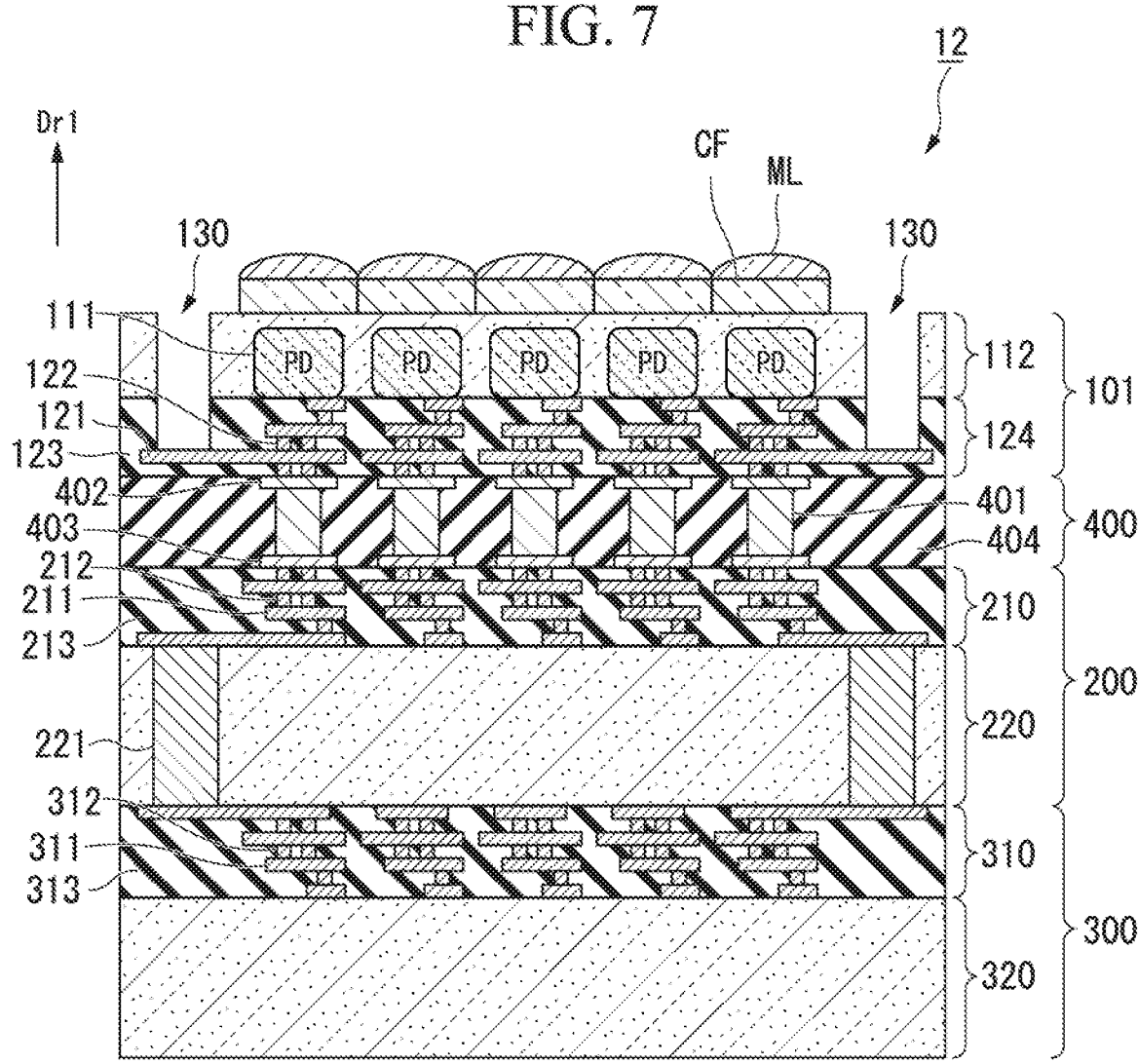
FIG. 7 is a sectional view of a solid-state imaging device according to a second modification example of the first embodiment of the present invention

FIG. 7 shows a configuration of a solid-state imaging device 12 according to a second modification example of the first embodiment. FIG. 7 shows a section of the solid-state imaging device 12. The configuration shown in FIG. 7 will be described while focusing on the difference with that shown in FIG. 1.

In the solid-state imaging device 12 shown in FIG. 7, the first substrate 100 in the solid-state imaging device 10 shown in FIG. 1 is changed to a first substrate 101. In the first substrate 101, the layer 110 of the first substrate 100 is changed to a layer 112 and the layer 120 of the first substrate 100 is changed to a layer 124. The layer 112 will be described while focusing on the difference with the layer 110 and the layer 124 will be described while focusing on the difference with the layer 120.

In the layer 112 and the layer 124, openings 130 are disposed. The openings 130 penetrate the layer 112. The openings 130 are formed, so that the wirings 121 are exposed. In FIG. 7, the lowest wiring 121 is exposed. The exposed wiring 121 serves as a pad which is an electrode electrically connected to an external package. A wire is connected to the wiring 121 by wire bonding.

Other than the above, the configuration shown in FIG. 7 is the same as that shown in FIG. 1.

The openings 130 are disposed so that the solid-state imaging device 12 can output signals to external circuits of the solid-state imaging device 12.

Second Embodiment

Figure 8:
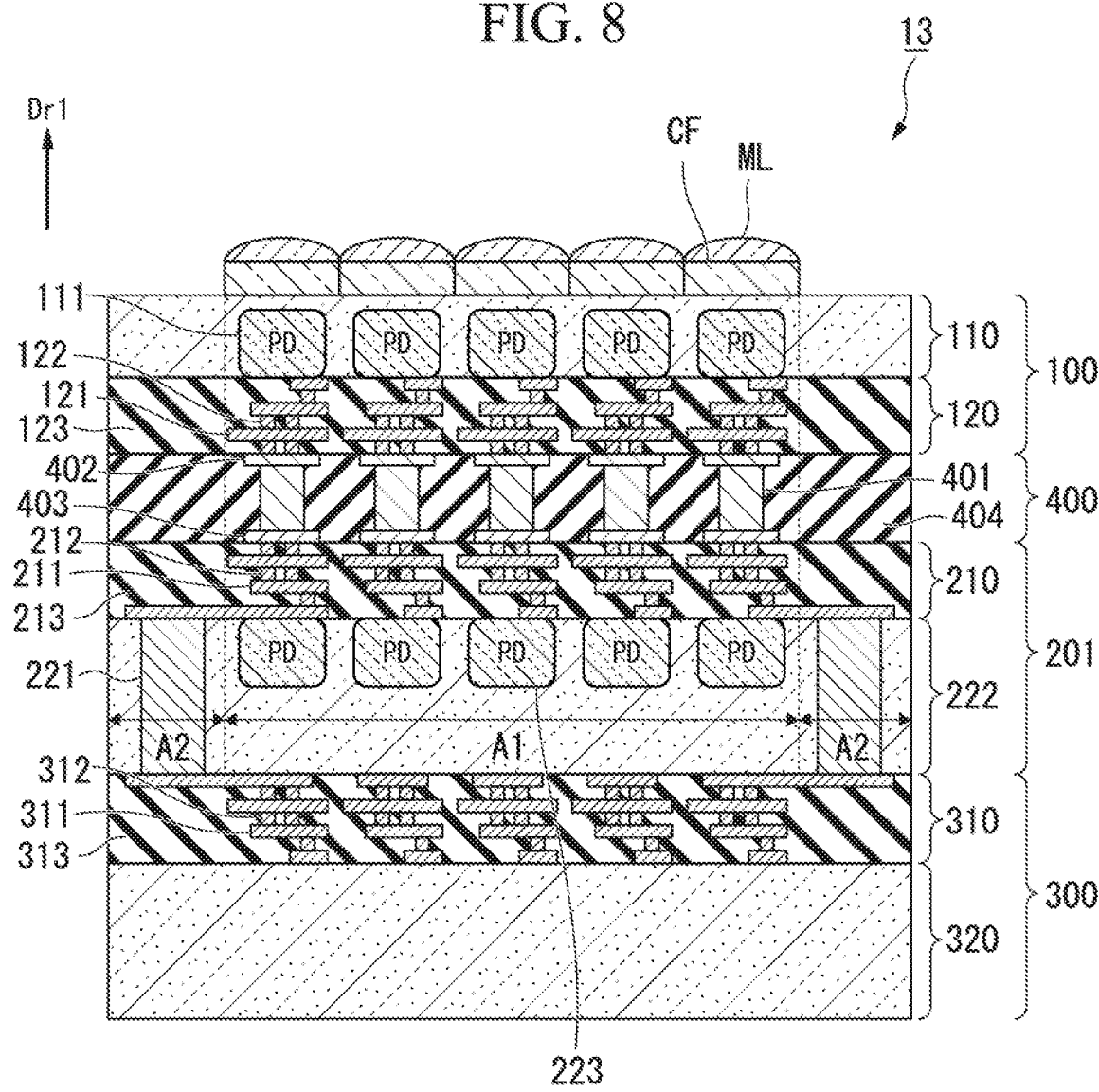
FIG. 8 is a sectional view of a solid-state imaging device according to a second embodiment of the present invention.

FIG. 8 shows a configuration of a solid-state imaging device 13 according to a second embodiment of the present invention. FIG. 8 shows a section of the solid-state imaging device 13. The configuration shown in FIG. 8 will be described while focusing on the difference with that shown in FIG. 1.

In the solid-state imaging device 13 shown in FIG. 8, the second substrate 200 in the solid-state imaging device 10 shown in FIG. 1 is changed to a second substrate 201. In the second substrate 201, the layer 220 of the second substrate 200 is changed to a layer 222. The layer 222 will be described while focusing on the difference with the layer 220.

The layer 222 has a plurality of photoelectric conversion elements 223 (photodiodes). FIG. 8 shows a reference numeral of one photoelectric conversion element 223 as a representative. The photoelectric conversion elements 223 are disposed in the area A1. For example, the photoelectric conversion element 223 is made of a semiconductor material having an impurity concentration different from that of the semiconductor material constituting the layer 222. The photoelectric conversion element 223 converts light into a signal.

For example, the photoelectric conversion element 223 can serve as a phase difference autofocus pixel. An imaging apparatus has the solid-state imaging device 13. The imaging apparatus can estimate the position of an object to be imaged with respect to a focal position of an imaging lens on the basis of a signal generated by the photoelectric conversion element 223. The imaging apparatus can adjust the focal position of the imaging lens in accordance with the estimation result.

The photoelectric conversion element 223 may acquire a signal based on special light. For example, the special light includes fluorescence. In a medical site, a lesioned part is observed using a color image and a fluorescent image. For example, exciting light is irradiated to an indocyanine green (ICG) and fluorescence is detected from a lesioned part. The ICG is a fluorescent material. The ICG is administered in advance to a body of a person to be inspected. The ICG is excited in an infrared region by the exciting light and emits fluorescence. The administered ICG is accumulated at a lesioned part of a cancer and the like. Since strong fluorescence is generated from the lesioned part, an inspector can determine the presence or absence of the lesioned part on the basis of a captured fluorescent image. For example, a filter is disposed between the photoelectric conversion element 223 and the photoelectric conversion element 111 to allow only fluorescence to pass therethrough. The photoelectric conversion elements 223 generate signals based on the fluorescence.

The special light may include narrow-band light. Light having a wavelength which is easily absorbed in hemoglobin of blood is irradiated to a blood vessel, so that it is possible to acquire an image with an emphasized blood vessel. For example, blue narrow-band light or green narrow-band light is irradiated to a blood vessel. For example, a filter is disposed between the photoelectric conversion element 223 and the photoelectric conversion element 111 to allow only narrow-band light to pass therethrough. The photoelectric conversion elements 223 generate signals based on the narrow-band light.

Other than the above, the configuration shown in FIG. 8 is the same as that shown in FIG. 1.

It is sufficient if the second substrate 201 has at least one of the reading circuit, the memory 138, the processing circuits 505, and the plurality of photoelectric conversion elements 223 (second photoelectric conversion elements). At least one of the reading circuit, the memory 138, the processing circuits 505, and the plurality of photoelectric conversion elements 223 is disposed in the area A1.

In the solid-state imaging device 13 of the second embodiment, similarly to the first embodiment, an influence on the characteristics of the circuits disposed in the area A1 from the plurality of through electrodes 221 is reduced.

Third Embodiment

Figure 9:
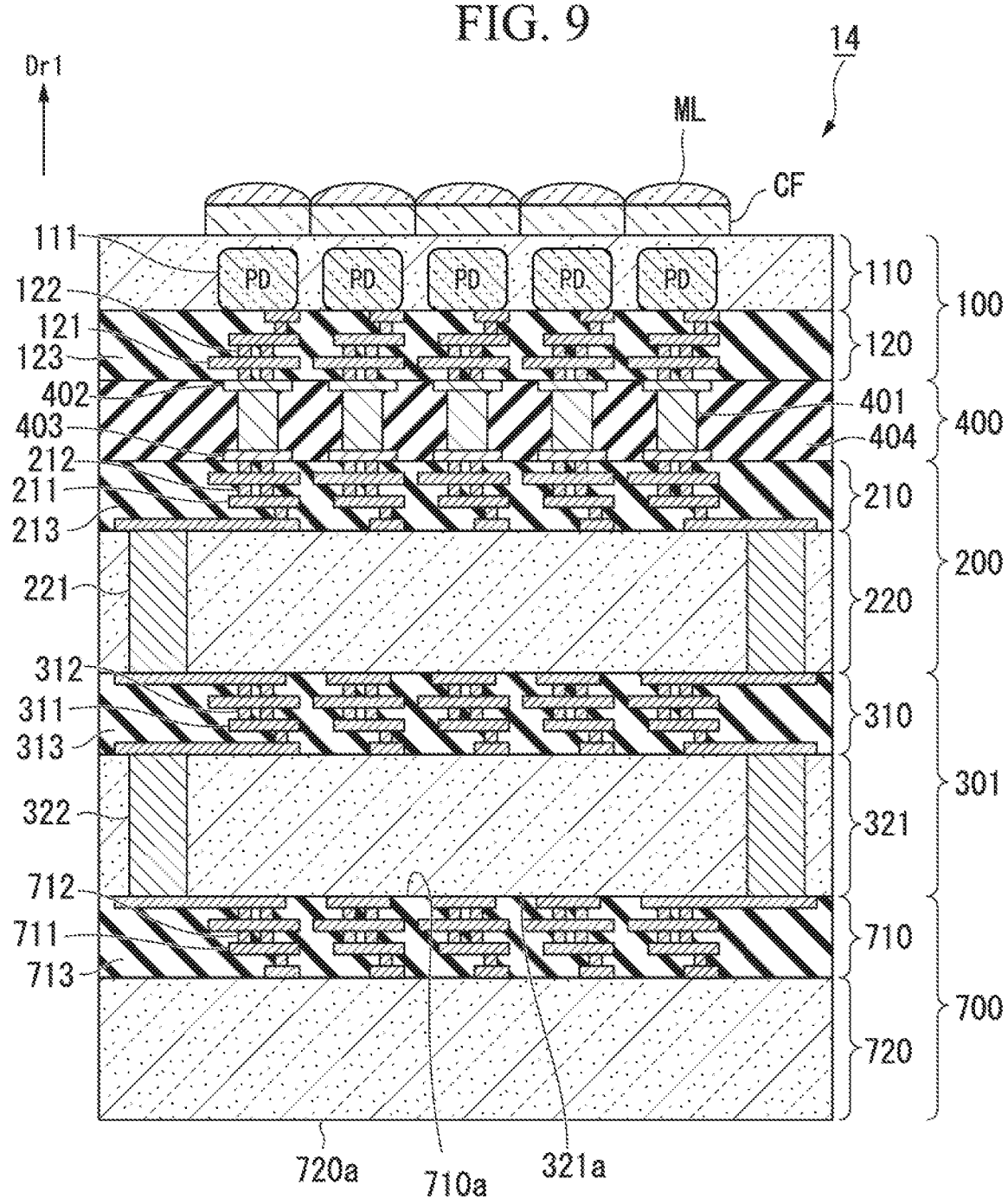
FIG. 9 is a sectional view of a solid-state imaging device according to a third embodiment of the present invention.

FIG. 9 shows a configuration of a solid-state imaging device 14 according to a third embodiment of the present invention. FIG. 9 shows a section of the solid-state imaging device 14. The configuration shown in FIG. 9 will be described while focusing on the difference with that shown in FIG. 1.

In the solid-state imaging device 14 shown in FIG. 9, the third substrate 300 in the solid-state imaging device 10 shown in FIG. 1 is changed to a third substrate 301. The third substrate 301 is the same as the third substrate 301 in the solid-state imaging device 11 shown in FIG. 6.

The solid-state imaging device 14 has a fourth substrate 700. The fourth substrate 700 has a layer 710 (a wiring layer) and a layer 720 (a semiconductor layer). The layer 710 and the layer 720 are stacked in the thickness direction Dr1 of the first substrate 100. The layer 710 and the layer 720 are in contact with each other.

The layer 710 has a surface 710a. The surface 710a faces the surface 321a. The surface 710a is in contact with the third substrate 301. The surface 710a is a principal surface of the fourth substrate 700. The principal surface of the fourth substrate 700 is a relatively wide surface of a plurality of surfaces constituting the surface of the fourth substrate 700. The layer 710 has a plurality of wirings 711, a plurality of vias 712, and an interlayer insulating film 713. FIG. 9 shows reference numerals of one wiring 711 and one via 712 as representatives.

The wiring 711 and the via 712 are made of a conductive material. The wiring 711 and the via 712 may be made of conductive materials different from each other. The wiring 711 is a thin film having a wiring pattern formed thereon. The wirings 711 is in contact with the through electrodes 322. The wirings 711 transmit signals output from the third substrate 301. A wiring 711 with only one layer may be disposed or a wiring 711 with a plurality of layers may be disposed. In the example shown in FIG. 9, the wiring 711 with four layers is disposed.

The vias 712 connect the wirings 711 of respective layers to one another. In the layer 710, parts other than the wirings 711 and the vias 712 are made of the interlayer insulating film 713. The interlayer insulating film 713 is made of an insulating material.

The layer 720 is stacked in the thickness direction Dr1 of the first substrate 100 with respect to the layer 710. The layer 720 is made of a semiconductor material. The layer 720 has a surface 720a. The surface 720a is a principal surface of the fourth substrate 700. The surface 710a and the surface 720a face in opposite directions.

In FIG. 9, the fourth substrate 700 has two layers. The fourth substrate 700 may have only one layer. Alternatively, the fourth substrate 700 may have three or more layers.

The third substrate 301 does not have the memory circuit 506 and the fourth substrate 700 has the memory circuit 506. The processing circuits 505 are disposed in the second substrate 200 and the third substrate 301. When areas of the processing circuits 505 are large, the processing circuits 505 can be dispersively disposed in a plurality of substrates. For example, the processing circuit 505 is an AD conversion circuit.

Other than the above, the configuration shown in FIG. 9 is the same as that shown in FIG. 1.

In the solid-state imaging device 14 of the third embodiment, similarly to the first embodiment, an influence on the characteristics of the circuits disposed in the area A1 from the plurality of through electrodes 221 is reduced.

Fourth Embodiment

Figure 10:
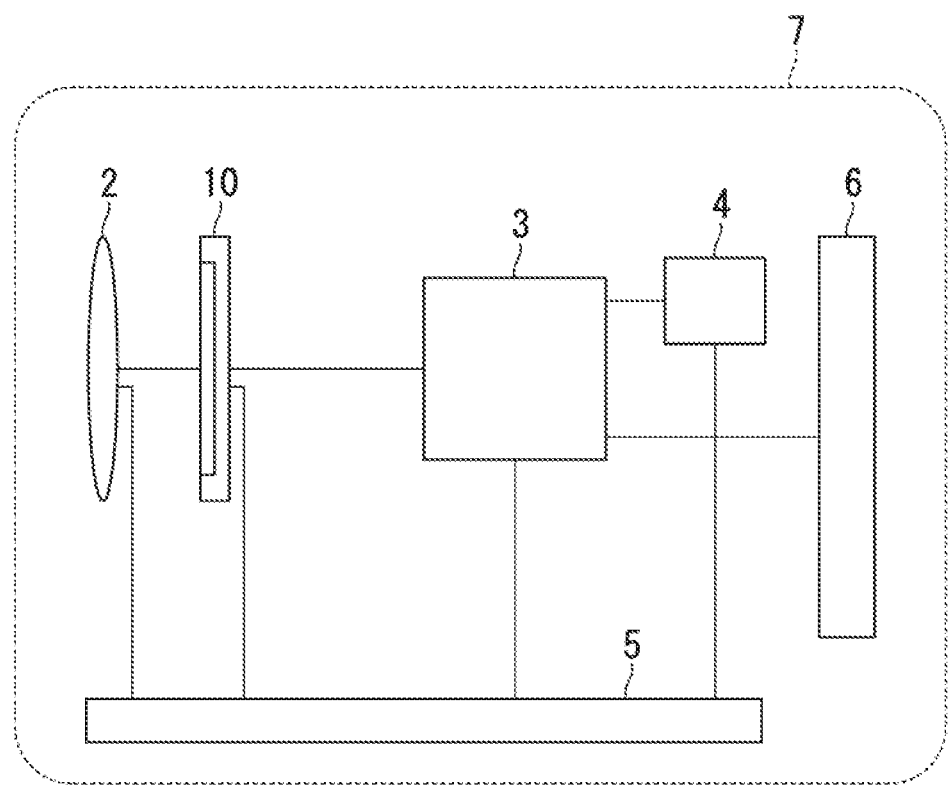
FIG. 10 is a block diagram showing a configuration of an imaging apparatus according to a fourth embodiment of the present invention.
Figure 11:
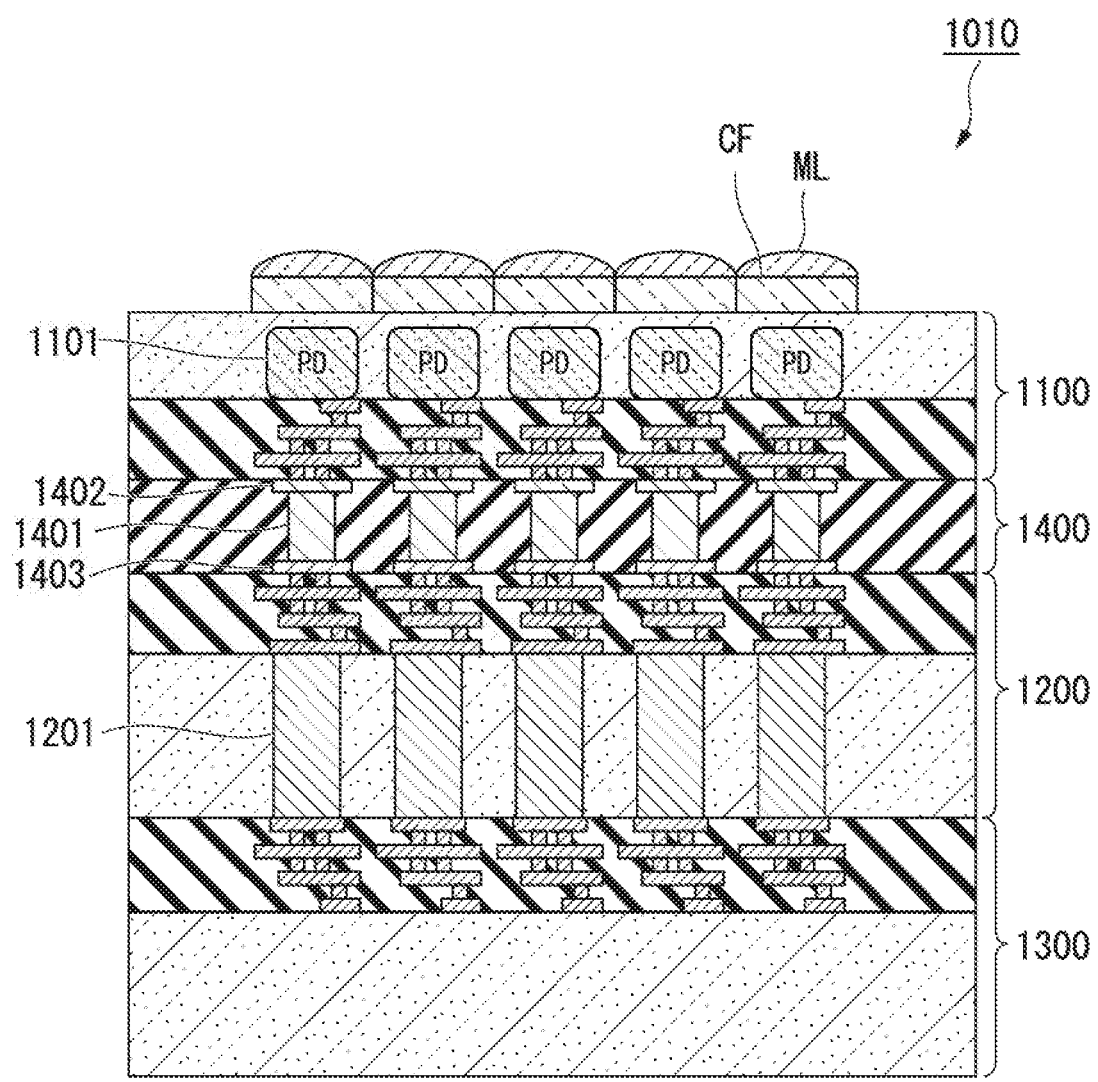
FIG. 11 is a sectional view of a solid-state imaging device of the related technology.

FIG. 10 shows a configuration of an imaging apparatus 7 of a fourth embodiment of the present invention. It is sufficient if the imaging apparatus 7 is an electronic apparatus having an imaging function. For example, the imaging apparatus 7 includes any one of a digital camera, a digital video camera, a monitoring camera, an endoscope, and a microscope. As shown in FIG. 10, the imaging apparatus 7 has a solid-state imaging device 10, a lens unit part 2, an image signal processing device 3, a recording device 4, a camera control device 5, and a display device 6.

The solid-state imaging device 10 is the solid-state imaging device 10 of the first embodiment. The lens unit part 2 has a zoom lens and a focus lens. The lens unit part 2 forms an object image based on light from an object on a light receiving surface of the solid-state imaging device 10. An image of the light captured via the lens unit part 2 is formed on the light receiving surface of the solid-state imaging device 10. The solid-state imaging device 10 converts the object image formed on the light receiving surface into an imaging signal and outputs the imaging signal.

The image signal processing device 3 performs prescribed processes on the imaging signal output from the solid-state imaging device 10. The processes performed by the image signal processing device 3 include conversion to image data, various types of image data correction, image data compression and the like.

The recording device 4 has a semiconductor memory and the like for recording or reading image data. The recording device 4 is detachable from the imaging apparatus 7. The display device 6 displays an image based on the image data processed by the image signal processing device 3 or the image data read from the recording device 4.

The camera control device 5 controls the whole of the imaging apparatus 7. An operation of the camera control device 5 is prescribed in a program stored in a ROM embedded in the imaging apparatus 7. The camera control device 5 reads the program, and performs various types of control according to content prescribed in the program.

The solid-state imaging device 10 may the solid-state imaging device shown in any one of FIG. 6 to FIG. 9.

As described above, the imaging apparatus 7 has the solid-state imaging device 10. The imaging apparatus of each aspect of the present invention need not have a configuration corresponding to at least one of the lens unit part 2, the image signal processing device 3, the recording device 4, the camera control device 5, and the display device 6.

In the fourth embodiment, similarly to the first embodiment, an influence on the characteristics of the circuits disposed in the area A1 from the plurality of through electrodes 221 is reduced.

While preferred embodiments of the invention have been described and shown above, it should be understood that these are exemplars of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solid-state imaging device comprising:
   a first substrate having a first principal surface, a second principal surface, and a plurality of first photoelectric conversion elements, the first principal surface and the second principal surface facing in opposite directions, the plurality of first photoelectric conversion elements being disposed in a matrix form;
   a second substrate having a third principal surface, a fourth principal surface, one or more first layers, and a plurality of first through electrodes, the third principal surface and the fourth principal surface facing in opposite directions, the third principal surface facing the second principal surface, the plurality of first through electrodes penetrating at least one of the first layers; and
   a third substrate having a fifth principal surface and a sixth principal surface, the fifth principal surface and the sixth principal surface facing in opposite directions, the fifth principal surface facing the fourth principal surface, wherein the plurality of first photoelectric conversion elements are disposed in a pixel area, the plurality of first through electrodes are disposed only in a second area around a first area corresponding to the pixel area, the first substrate and the second substrate are electrically connected to each other, the second substrate comprises:
- a first memory circuit disposed in the first area and configured to temporarily store signals output from the plurality of first photoelectric conversion elements;
- a processing circuit disposed in the first area and configured to process the signals stored in the first memory circuit; and
- a scanning circuit disposed in the second area and configured to control the plurality of first photoelectric conversion elements, the first memory circuit, and the processing circuit, the third substrate comprises:
- a second memory circuit connected to the scanning circuit by the plurality of first through electrodes and configured to store the signals processed by the processing circuit, the solid-state imaging device further comprises a plurality of microbumps disposed between the second principal surface and the third principal surface, and each microbump included in the plurality of microbumps is disposed for each first photoelectric conversion element included in the plurality of first photoelectric conversion elements and electrically connects the first photoelectric conversion element and the first memory circuit to each other.

2. The solid-state imaging device according to claim 1, further comprising:
a first connection layer disposed between the first substrate and the second substrate and connecting the first substrate and the second substrate to each other,
wherein a plurality of microbumps are disposed in the first connection layer.

3. The solid-state imaging device according to claim 1, further comprising:
a second connection layer that is disposed between the second substrate and the third substrate and connects the second substrate and the third substrate to each other.

4. The solid-state imaging device according to claim 1, wherein the third substrate further includes one or more second layers and a plurality of second through electrodes, and
the plurality of second through electrodes penetrate at least one of the second layers.

5. A solid-state imaging device comprising:
a first substrate having a first principal surface, a second principal surface, and a plurality of first photoelectric conversion elements, the first principal surface and the second principal surface facing in opposite directions, the plurality of first photoelectric conversion elements being disposed in a matrix form;
a second substrate having a third principal surface, a fourth principal surface, one or more first layers, and a plurality of first through electrodes, the third principal surface and the fourth principal surface facing in opposite directions, the third principal surface facing the second principal surface, the plurality of first through electrodes penetrating at least one of the first layers; and
a third substrate having a fifth principal surface and a sixth principal surface, the fifth principal surface and the sixth principal surface facing in opposite directions, the fifth principal surface facing the fourth principal surface, wherein the plurality of first photoelectric conversion elements are disposed in a pixel area, the plurality of first through electrodes are disposed only in a second area around a first area corresponding to the pixel area, the first substrate and the second substrate are electrically connected to each other, the second substrate comprises:
- a first memory circuit disposed in the first area and configured to temporarily store signals output from the plurality of first photoelectric conversion elements;
- a processing circuit disposed in the first area and configured to process the signals stored in the first memory circuit; and
- a scanning circuit disposed in the second area and configured to control the plurality of first photoelectric conversion elements, the first memory circuit, and the processing circuit, the third substrate comprises:
- a second memory circuit connected to the scanning circuit by the plurality of first through electrodes and configured to store the signals processed by the processing circuit, the second substrate includes a plurality of processing circuits including the processing circuit, each processing circuit included in the plurality of processing circuits is disposed for each column in an arrangement of the plurality of first photoelectric conversion elements, and each processing circuit included in the plurality of processing circuits processes the signals output from the first photoelectric conversion element corresponding to the column and stored in the first memory circuit.

6. A solid-state imaging device comprising:
a first substrate having a first principal surface, a second principal surface, and a plurality of first photoelectric conversion elements, the first principal surface and the second principal surface facing in opposite directions, the plurality of first photoelectric conversion elements being disposed in a matrix form;
a second substrate having a third principal surface, a fourth principal surface, one or more first layers, and a plurality of first through electrodes, the third principal surface and the fourth principal surface facing in opposite directions, the third principal surface facing the second principal surface, the plurality of first through electrodes penetrating at least one of the first layers; and
a third substrate having a fifth principal surface and a sixth principal surface, the fifth principal surface and the sixth principal surface facing in opposite directions, the fifth principal surface facing the fourth principal surface, wherein the plurality of first photoelectric conversion elements are disposed in a pixel area, the plurality of first through electrodes are disposed only in a second area around a first area corresponding to the pixel area, the first substrate and the second substrate are electrically connected to each other, the second substrate comprises:
- a first memory circuit disposed in the first area and configured to temporarily store signals output from the plurality of first photoelectric conversion elements;
- a processing circuit disposed in the first area and configured to process the signals stored in the first memory circuit; and
- a scanning circuit disposed in the second area and configured to control the plurality of first photoelectric conversion elements, the first memory circuit, and the processing circuit, the third substrate comprises:
- a second memory circuit connected to the scanning circuit by the plurality of first through electrodes and configured to store the signals processed by the processing circuit, the second substrate further includes at least one of a reading circuit and a plurality of second photoelectric conversion elements, the reading circuit is configured to read the signals from the plurality of first photoelectric conversion elements, and at least one of the reading circuit and the plurality of second photoelectric conversion elements is disposed in the first area.

* * * * *